United States Patent [19]

Oslund et al.

[11] Patent Number: 5,170,321
[45] Date of Patent: Dec. 8, 1992

[54] ENCLOSURE SYSTEM FOR ENVIRONMENTAL ISOLATION OF RF CIRCUITRY

[75] Inventors: Jeffrey E. Oslund, Wheaton; James K. Gehrke, Lake in the Hills; Anthony M. Pirih, Itasca, all of Ill.

[73] Assignee: Motorola, Inc., Schaumburg, Ill.

[21] Appl. No.: 632,728

[22] Filed: Dec. 24, 1990

[51] Int. Cl.⁵ .......................... H05K 7/20; H05K 9/00
[52] U.S. Cl. .................................. 361/386; 174/35 R; 174/35 GC; 361/424
[58] Field of Search ...................... 174/35 R, 35 GC; 361/386, 388–389, 395, 399, 424

[56] References Cited

U.S. PATENT DOCUMENTS

| | | | |
|---|---|---|---|
| 4,001,711 | 4/1977 | Knutson et al. | 361/424 |
| 4,370,515 | 1/1983 | Donaldson | 174/35 R |
| 4,384,165 | 5/1983 | Loving, Jr. et al. | 174/35 GC |
| 4,831,498 | 5/1989 | Baba | 361/424 |
| 4,890,199 | 12/1989 | Beatler | 361/424 |
| 5,043,848 | 8/1991 | Rogers et al. | 361/424 |

FOREIGN PATENT DOCUMENTS

| | | | |
|---|---|---|---|
| 1-25897 | 5/1989 | Japan | 174/35 R |
| 0094699 | 4/1990 | Japan | 174/35 R |
| 2-37099 | 9/1990 | Japan | 174/35 R |

OTHER PUBLICATIONS

White, "Shielding Design Methodolgy and Procedures", Interference Control Technologies, 1986, pp. 4.18–4.26.

Primary Examiner—Gregory D. Thompson
Attorney, Agent, or Firm—Joseph P. Krause; Steven G. Parmelee

[57] ABSTRACT

An enclosure system (100) is disclosed which has a conductive cover shield (102) which is retained in contact with a substrate (104) having a radio frequency (RF) circuit disposed thereon. The enclosure system (100) is made up of a conductive area (116), disposed on the substrate (104) peripherally about the electrical circuit which is then connected to the conductive cover shield (102). This connection allows for substantial horizontal displacement (305, 305') of the substrate material (104). The natural resilience of the substrate (104) material then allows for substantial vertical displacement of the conductive cover shield (102) with respect to the substrate (104) without substantial loss of contact pressure between the conductive cover shield (102) and the conductive area (116). Additionally, this form of connection provides for at least partial isolation of the RF energy from an environment outside of the enclosure system.

6 Claims, 2 Drawing Sheets

ENCLOSURE SYSTEM FOR ENVIRONMENTAL ISOLATION OF RF CIRCUITRY

FIELD OF THE INVENTION

The present invention relates generally to shielding of RF circuitry, and more particularly to an improved enclosure system for isolating, both electrically and thermally, RF circuitry from its external environment.

BACKGROUND OF THE INVENTION

The requirement for isolation of both radio frequency (RF) and thermal energy has existed since the beginning of the electronic age. For every circuit that generates these two forms of energy, there is a desire to isolate this energy from the external environment in which that circuit operates. In general, it is highly desirable to minimize the effect that a given circuit has on its environment as well as the effect that the environment has on the circuit. This is especially true in communication system applications where high levels of RF radiation and thermal energy, in the form of heat, are commonplace.

Typically, there are three areas which are of primary concern to the RF circuit designer. They are to provide adequate RF isolation (on the order of 25-35 dB attenuation), adequate dissipation of heat, and sufficient contact pressure between the enclosure system and the circuit ground plane. These three characteristics require the system to be designed with exacting precision and flexibility to accommodate changes in the systems environment. Keeping in mind that the environment in which the enclosure system resides is itself a dynamic system, it is of paramount importance that consideration be given specifically to a few key parameters. Mechanical tolerance build-up, or mechanical stack-up, is a common problem which warrants thoughtful design consideration. Mating piece parts of known dimensions in a predetermined way, even in a highly manufacturable process, yields mechanical tolerance build-up, which has an undesirable, perhaps disastrous, impact on the performance of the final product. Examples of this may include piece parts which are worst case in terms of mechanical tolerance, even slightly convex or concave, or any combination of the two. Of course, the more piece parts that a given enclosure system design requires, the more subject it is to the consequences of this undesirable phenomenon. Clearly, the issue of mechanical tolerance build-up is among the top of all assembly process problems, and also a costly one when one considers the labor required to re-work or scrap the units which don't meet final specifications. Also, the stresses to which the enclosure system is subject during operation may serve to change the physical characteristics which affect these critical system parameters. As is the case with most electronic circuits, the enclosure system for such circuits is subject to thermal stresses, vibration, shock pulses, and often, RF energy emitted from a circuit external to the enclosure system. All of the aforementioned conditions need to be addressed in the design of an enclosure system for optimal performance regarding isolation of the target circuit.

Typically, shielding of this type is provided by a conductive metal enclosure which is held at a fixed electrical potential. Ordinarily, the enclosure has two portions; the first portion defines the housing for the electronic circuitry, while the second portion of the enclosure acts as a cover shield. Since the required spacing between points of electrical contact is proportional to the wavelength of the signal being attenuated, the spacing requirements depend on the frequency of the undesired RF radiation. Specifically, spacing between points of electrical contact along the joint of the cover and housing need only be less than the 1/20th wavelength of the RF radiation frequency. At high radio frequencies (i.e., MHz and GHz) the associated 1/20th wavelength of an electromagnetic wave becomes sufficiently short so that even a small gap in the electrical and physical connection of two separate pieces of housing can be enough to allow a leak of the high frequency electromagnetic radiation through the shield. At lower RF frequencies this is not a substantial problem, since the 1/20th wavelengths of the lower RF frequencies are of a physical length such that spacing between good electrical contact points where the two housing parts mate, are rarely sufficiently large enough to let the relatively long 1/20th wavelength of low frequency RF leak through the shield.

U.S. Pat. No. 4,831,498, "Shield Structure for Circuit on Circuit Board", shows the use of a continuous rib structure on a cast cover member which makes physical contact with a conductive pattern on the circuit board. This type of structure is either difficult to precisely manufacture, for example within flatness specifications, due to casting tolerances, or very costly if one should attempt to machine this part. Furthermore, a non-compliant rib structure, such as the one employed, is likely to lose contact with the conductive pattern over time. This may be due to warping or any other effect which alters the flatness characteristic of the either the cover, the circuit board, or both. Additionally, the issue of heat dissipation is not addressed by such an enclosure.

U.S. Pat. No. 4,384,165, "Radio Frequency Shield with Force Multiplier Interconnection Fingers for an Electromagnetic Gasket", shows the use of highly resilient finger projections on the cover piece being forced against the mating enclosure piece to make electrical contact between the two pieces. While this solution overcomes the problem of maintaining contact pressure through the use of resilient fingers, these fingers are both costly, and difficult to manufacture, perhaps even impossible for applications approaching 1 GHz and beyond. The issue of heat dissipation is also not addressed by this design.

Another attempted solution, a portion of which is shown in FIG. 2, uses a conductive wire mesh, or RF braid, to form an electromagnetic shield around the target circuit. The enclosure consists of a housing 23 and a flat planar cover plate 25. The housing 23 includes flat planar shoulder 23A along the perimeter of an access opening 26 into the housing 23. The housing shoulder 23A has a channel 29 cut into its surface. RF braid 27, a conductive wire mesh, is inserted into the channel 29 formed in housing shoulder 23A. The cross-sectional area of RF braid 27 is sufficiently great so that when it is fitted into channel 29 a significant portion of it is above the plane defined by housing shoulder 23A. Cover plate 25 is aligned over housing shoulder 23A by mating screw holes 31A in cover plate 25 and mating screw holes 31B in housing shoulder 23A. Screws 33 secure cover plate 25 flush against housing shoulder 23A. The RF braid 27 is compressed by the flush engagement of cover plate 25 with housing shoulder 23A. While this system has been shown to provide as much as 60 dB attenuation, the RF braid is a very costly piece-part and it also provides a significant challenge to the operator placing the RF braid in the channel during the assembly process. Furthermore, the electrical contact made between the cover shield and the RF braid is difficult to maintain over time due to diminishing contact pressure provided by the less-than resilient braid material. Therefore, in terms of a practical solution to providing approximately 30 dB isolation, the RF braid design falls considerably short of the mark.

Accordingly, there exists a dire need for a cost effective, easily manufacturable, effective means for isolating both RF and thermal energy emitted from an electronic circuit from an external environment in which the circuit resides. The enclosure system must also be designed with enough flexibility so as to have continued success through the operational life cycle of the electronic circuitry, whose environment is itself a dynamic system undergoing many changes.

SUMMARY OF THE INVENTION

The present invention encompasses an enclosure system having a conductive cover shield which is retained in contact with a substrate having a radio frequency (RF) circuit disposed thereon. The enclosure system is made up of a conductive area, disposed on the substrate peripherally about the electrical circuit which is then connected to the conductive cover shield. This connection allows for substantial horizontal displacement of the substrate material. The natural resilience of the substrate material then allows for substantial vertical displacement of the cover shield with respect to the substrate without substantial loss of contact pressure between the conductive cover shield and the conductive area. Additionally, this form of connection provides for at least partial isolation of the RF energy from an environment outside of the enclosure system.

DETAILED DESCRIPTION OF A PREFERRED EMBODIMENT

Figure 1:
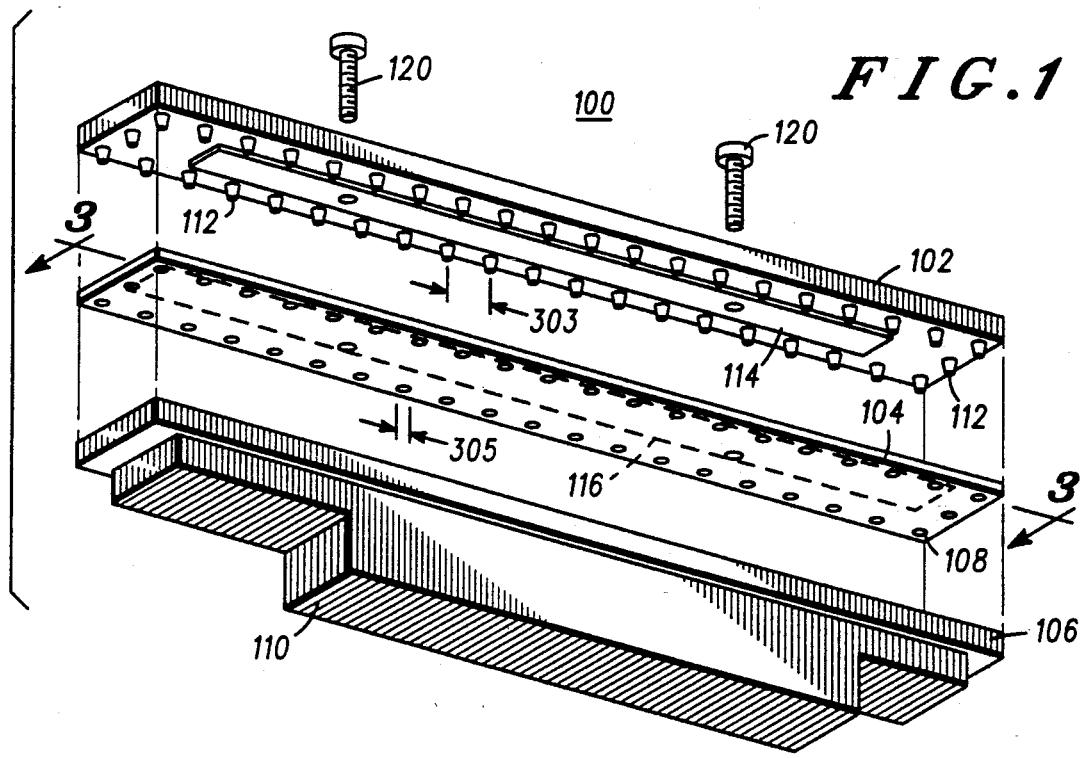
FIG. 1 is an isometric drawing of an enclosure system in accordance with the present invention.
Figure 2:
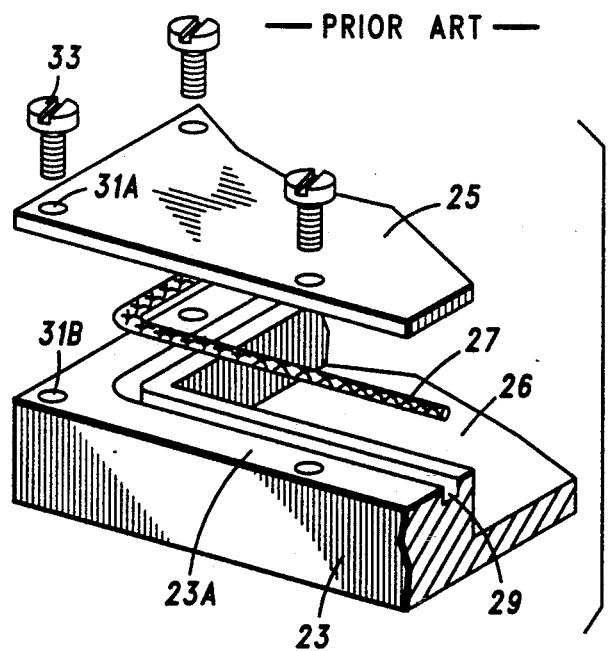
FIG. 2 is a portion of an electrical circuit housing known in the art.

Referring to enclosure system 100, substrate 104 holds an electrical circuit, such as that used in a transmitting portion of an RF communication system. Housing member 106 has a recessed portion 110 which allows room for components within the electrical circuit whose physical height would not otherwise be accommodated. The cover shield 102 has a plurality of nibs 112 disposed on the periphery of the cover shield 102, uniformly spaced at a distance 303. These nibs 112 are aligned in order to mate with a plurality of holes 108 placed in the substrate 104. The physical dimension of the nibs and mating holes are such that the minimum hole width is both larger than the minimum nib width. and smaller than the maximum nib width. It is under these conditions that the nib may be inserted, at least partially, into the hole and still make sufficient physical contact with the hole wall, or walls. Also, a conductive area 116 is disposed on the top side of the substrate 104, aligned with the holes 108 and extending along the interior surface of each of the holes 108 such that it comes in electrical contact with the nibs 112 when the cover shield 102 and substrate 104 are mated. This conductive area 116 also serves as an electrical ground plane for the electrical circuit, and by mating this ground plane with the cover shield 102, the RF shield formed by the nibs 112 is placed at the same electric potential as the ground plane. In order to provide contact pressure between the nibs 112 and the holes 108, and hence the conductive area 116, screws 120 are used to secure the cover shield 102 through the substrate 104 and into the housing member 106. Finally, in a preferred embodiment of the present invention, a thermal pad 114 is cast into the cover shield 102 in order to dissipate thermal energy emitted from the circuitry on the substrate 104.

Figure 3A:
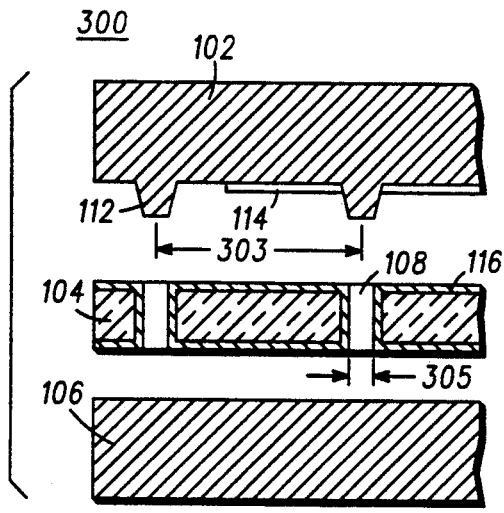
FIG. 3A is a close up view of a portion of the individual components which comprise an enclosure system in accordance with the present invention.

Referring to arrangement 300 shown in FIG. 3A, it can be seen that the nibs 112, may take on a shape such as a tapered cylinder, in order to optimize the horizontal displacement of the substrate material upon insertion into the respective holes 108. It is within the scope of the present invention to utilize other nib shapes toward this end. Any such scheme is employed to take advantage of the local compliance of the substrate around the holes, which compliance may be enhanced by altering the shape of the holes. Such shapes may include slots, star-shapes, or any other such shape that is manufacturable and suitable for enhancing effective contact pressure between the conductive area 116 and the cover shield 102.

Figure 4B:
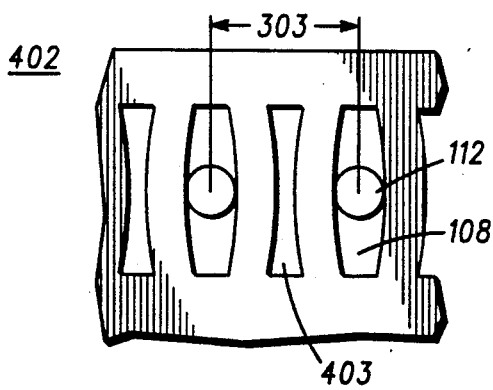
FIG. 4B is a close up view of a substrate and a second possible arrangement for the mating components in accordance with the present invention.
Figure 4A:
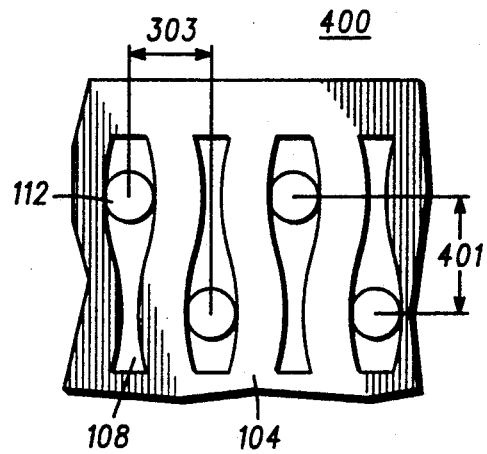
FIG. 4A is a close up view of a substrate and one possible arrangement for the mating components in accordance with the present invention.

In order to continuously maintain sufficient contact pressure, for example to ensure less than 10 milli-ohms contact resistance, in a system where the thermal pad is non-resilient, the substrate 104 material must be somewhat compliant in the area where contact is made. This may be accomplished, for example, by placing the mating components (nibs 112 and holes 108) in a pattern such that compliance is ensured. Two alternatives (e.g., arrangements 400, 402) for are shown in FIGS. 4A and 4B, where adjacent nib/hole mating sections may be staggered (i.e., adjacent nibs being non-collinear with respect to each other) distance 401 or non-mating cavities 403 may be added, in order to increase the effective compliance of the substrate material around the holes 108.

Figure 3B:
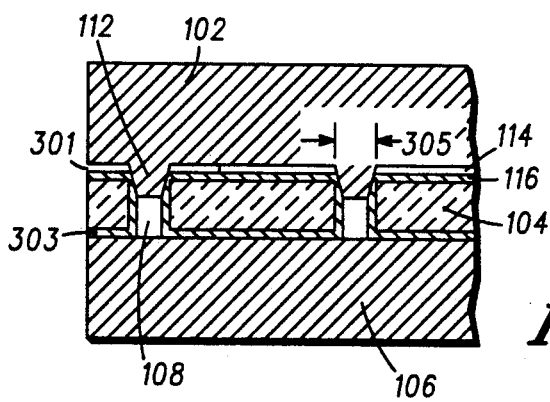
FIG. 3B is the components of FIG. 3A mated in such a way as to embody a technique of RF and thermal energy isolation in accordance with the present invention.

Referring back to FIG. 3B, this compliance is depicted as the width 305 is deformed to a larger width 305', upon insertion of the nibs 112 into the holes 108. In the preferred embodiment of the present invention, this compliance is on the order of 0.33 mm total horizontal displacement in the plane of the substrate 104 as measured from the center of the hole 108. It is this compliance that allows the contact pressure to remain relatively constant over the operational life cycle of the target circuit, ensuring adequate electrical contact between the cover 102 and conductive area 106. It is appropriate to note that hole/nib mating structures may also be designed so as to force electrical contact between the housing member 106 and the plated holes 108 in the substrate 104. An example of this is when a star-shaped hole is mated with a tapered cylinder nib such that, upon insertion of the nib, the hole partially deflects across interface junction 303, creating electrical contact between conductive layer 116 and housing member 106. This creates a similar spaced-nib effect on the bottom side of the substrate 104 in the case where there are RF emitting components on both sides. Of course, the same effect can be obtained by alternately distributing nibs on the cover 102 and housing member 106 for mating with holes 108 in the substrate 104 disposed between them.

It can be shown, through the following equation, that the distance 303 between adjacent nibs on the cover shield 102 can be optimized in order to attenuate radio frequency waves having a particular wavelength. Using a known equation to calculate the shielding effectiveness of an aperture having dimensions of 'w'×'h', both in mm, which can be considered analogous to uniformly spaced nibs for purposes of such calculation, the attenuation, in dB, of RF energy having a frequency of 'f' Mhz can be calculated as:

$$Att_{dB} = 97 - (10)\log_{10}[(W_{mm})(h_{mm})((f_{MHz})^2)] + Att_{shad}$$

where $Att_{shad}$ represents a shadow effect which adds approximately 3 dB of attenuation. Using the above equation, it can be shown that approximately 31 dB attenuation can be obtained on a 1 GHz frequency signal by using approximately 8 millimeter spacing between adjacent nibs 112, through a gap approximately 1 mm high.

Turning again to FIG. 3B, it can be seen that the thermal pad 114 may be located between the adjoined cover shield 102 and substrate 104, providing a means for dissipating some of the heat generated by the electrical circuit on the substrate 104. Also shown is the interface junction 301 through which the RF energy emitted by the electrical circuit may leak out into the external environment, and undesired RF radiation may enter the enclosure system. The same is true of interface junction 303, of course, when RF emitting components are present on both sides of the substrate 104.

Figure 5:
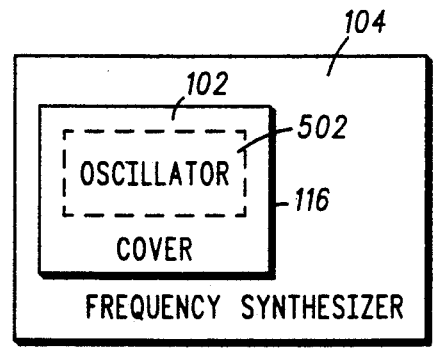
FIG. 5 is a simplified block diagram depicting a frequency synthesizer which uses an enclosure system in accordance with the present invention.

FIG. 5 shows a typical application which may embody the present invention. Shown is a block diagram 500 of a frequency synthesizer, whose components are disposed on a substrate 104. These components include an oscillator section 502, which may take up only a small portion of the physical space on the substrate 104. Surrounding the oscillator section 502 is a conductive area 116, which is then mated to a conductive cover shield 102 in accordance with the present invention.

What is claimed is:

1. An enclosure system having a conductive cover shield, the enclosure system being retained in contact with a substrate having an electrical circuit disposed thereon, the electrical circuit capable of generating thermal and radio frequency (RF) energy, the enclosure system comprising:

a conductive area, disposed on the substrate peripherally about the electrical circuit;

a plurality of protruding nibs disposed on a periphery of the conductive cover shield, wherein adjacent ones of said protruding nibs are staggered; and means, disposed on the substrate, for mating the conductive area and the protruding nibs, such that horizontal displacement of the substrate material is sufficient to provide electrical contact between the conductive area and the protruding nibs.

2. An enclosure system having a conductive cover shield, the enclosure system being retained in contact with a substrate having an electrical circuit disposed thereon, the electrical circuit capable of generating thermal and radio frequency (RF) energy, the enclosure system comprising:

a conductive area disposed on the substrate peripherally about the electrical circuit;

a plurality of protruding nibs disposed on a periphery of the conductive cover shield;

a plurality of mating cavities disposed opposite said plurality of protruding nibs on the substrate and aligned for mating through said conductive area; and a plurality of non-mating cavities alternately disposed among the plurality of mating cavities on the substrate.

3. An enclosure system having a conductive cover shield and housing, the enclosure system being retained in contact with a substrate having an electrical circuit disposed thereon, the electrical circuit capable of generating thermal and radio frequency (RF) energy and having a conductive area disposed on the substrate peripherally about the electrical circuit which acts as an electrical ground plane for the electrical circuit, the enclosure system comprising:

a plurality of protruding nibs disposed on a periphery of the conductive cover shield;

means, disposed on the substrate, for mating the conductive area and the plurality of protruding nibs, such that horizontal displacement of the substrate material is sufficient to maintain a maximum of 10 milli-Ohms of contact resistance between the nibs and the conductive area; and means for dissipating at least part of the thermal energy emitted from the electrical circuit.

4. An enclosure system in accordance with claim 3, wherein said protruding nibs are uniformly spaced about said periphery, thereby substantially attenuating RF energy having a wavelength proportional to said uniform spacing.

5. An enclosure system in accordance with claim 3, wherein said means for mating comprises a plurality of mating cavities disposed opposite said plurality of protruding nibs on the substrate and aligned for mating through said conductive area; and a plurality of non-mating cavities alternately disposed among the plurality of mating cavities on the substrate.

6. An enclosure system in accordance with claim 3, wherein adjacent ones of said protruding nibs are staggered, such that adjacent nibs are mated with the conductive area at points which are substantially non-collinear with respect to each other.

* * * * *